United States Patent [19]

Tran

[11] Patent Number: 5,343,093
[45] Date of Patent: Aug. 30, 1994

[54] SELF REFERENCING MOS TO ECL LEVEL CONVERSION CIRCUIT

[75] Inventor: Hien V. Tran, Carrollton, Tex.

[73] Assignee: Texas Instruments Incorporated, Dallas, Tex.

[21] Appl. No.: 962,422

[22] Filed: Oct. 16, 1992

Related U.S. Application Data

[63] Continuation-in-part of Ser. No. 199,558, May 27, 1988, abandoned.

[51] Int. Cl.$^5$ .............................................. H03K 17/12
[52] U.S. Cl. .................................... 307/475; 307/443
[58] Field of Search ................ 307/443, 454, 455, 475

[56] References Cited

U.S. PATENT DOCUMENTS

| | | | |
|---|---|---|---|
| 4,516,039 | 5/1985 | Matsuzaki et al. | 307/443 X |
| 4,645,951 | 2/1987 | Uragami | 307/443 X |
| 5,126,597 | 6/1992 | Usami et al. | 307/475 X |
| 5,160,857 | 11/1992 | Barre | 307/475 X |

Primary Examiner—David R. Hudspeth
Attorney, Agent, or Firm—Douglas A. Sorensen; Richard L. Donaldson; William E. Hiller

[57] ABSTRACT

A MOS to ECL level conversion circuit is disclosed which comprises transistors forming a differential pair connected to a current source. One of the transistors is configured as a diode and is self-referencing in that it supplies its own reference voltage level.

7 Claims, 6 Drawing Sheets

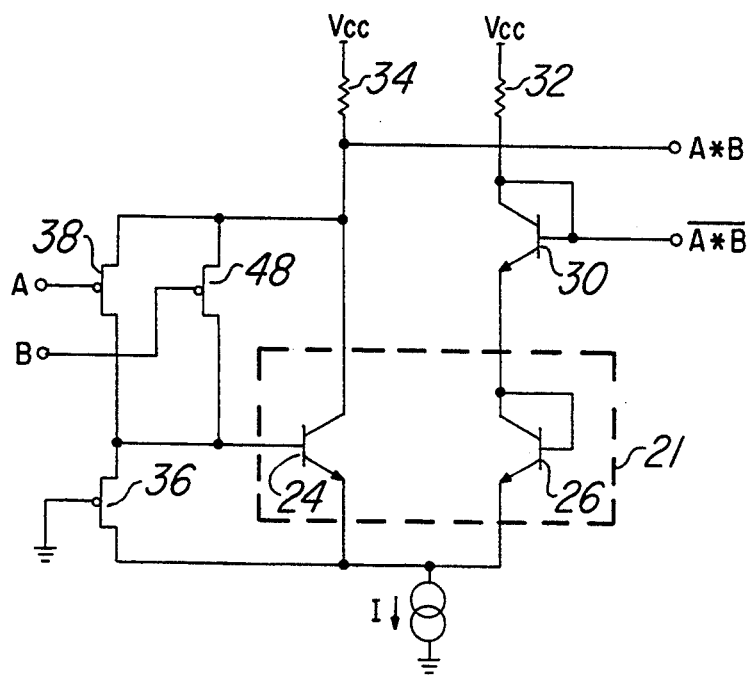
Fig. 6
| A | B | A*B | $\overline{A*B}$ |
|---|---|-----|------|
| 0 | 0 | 0 | 1 |
| 0 | 1 | 0 | 1 |
| 1 | 0 | 0 | 1 |
| 1 | 1 | 1 | 0 |
Fig. 6a
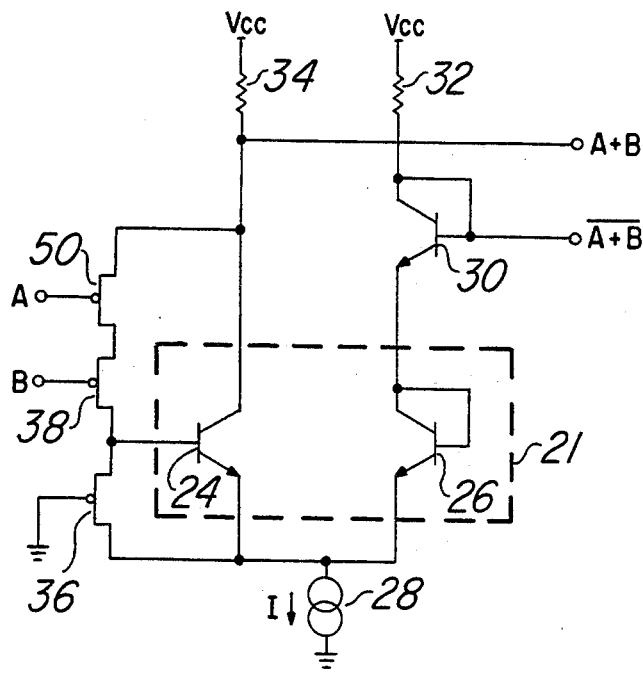
Fig. 7
| A | B | A+B | $\overline{A+B}$ |
|---|---|-----|------|
| 0 | 0 | 0 | 1 |
| 0 | 1 | 1 | 0 |
| 1 | 0 | 1 | 0 |
| 1 | 1 | 1 | 0 |
Fig. 7a

SELF REFERENCING MOS TO ECL LEVEL CONVERSION CIRCUIT

This is a continuation-in-part of application Ser. No. 07/199,558 now abandoned, filed on May 27, 1988 by Hiep Van Tran for an invention entitled MOS to ECL Level Conversion Circuit.

A MOS (metal oxide semiconductor) (also including CMOS (complementary metal oxide semiconductor) to ECL (emitter coupled logic) level conversion circuit changes the voltage levels associated with MOS circuitry to levels compatible with ECL circuitry. With reference to FIG. 1a which shows a voltage vs. time switching transition for MOS and ECL devices respectively, it is shown the MOS voltage swings range from a logic high to a logic low of about Vcc to Vee, a range of about 5 volts. FIG. 1a also shows that ECL voltage levels range from a logic high to a logic low of significantly smaller than that associated with MOS levels. ECL ranges are typically about 0.8 volts or smaller.

A typical circuit for converting MOS to ECL levels is shown in FIG. 1b which is a circuit schematic showing MOS transistor differential pair 3 comprising transistors 2 and 4 connected to the collector of bipolar transistor 6. Transistor 6 serves as a current source. The emitter of transistor 6 is connected to resistor 12 which is connected to ground and the base of transistor 6 is connected to reference voltage node Vref. Resistors 8 and 10 are connected between Vcc, the circuit supply voltage and an associated transistor from pair 3. The output voltage node Vout is connected between resistor 10 and transistor 4. Inverter 14 is connected to input node Vin and gate 18 of transistor 4 and thus, in proper operation, sends an inverted signal from Vin to gate 18. Gate 16 of transistor 2 is connected to node Vin and receives a non-inverted signal from Vin.

Differential pair 3 of FIG. 1b switches current through itself and generally has high input gate loading ad thus slow switching speed. N-channel transistors 2, 4 working in the high body effect region in a grounded p-substrate resulting from a BiCMOS (bipolar complementary metal oxide semiconductor) process severely decrease current drive capability of the circuit shown in FIG. 1a and slow the switching speed of the same even further. The body effect generally refers to an n-channel transistor's substrate being at a lower potential than its source, thereby increasing the threshold voltage of the transistor.

An unsymmetrical signal to gates 16 and 18 which result in turning both transistors 2 and 4 of FIG. 1 off (shown in FIG. 1 as open switches) could possibly create a forward bias at the collector-base junction of transistor 6. Once the collector-base is forward biased, the base voltage drops significantly and a current spike occurs in the base current. Therefore, the drop in the collector voltage due to both transistors 2 and 4 of MOS pair 3 being turned off causes malfunction noise through reference voltage lines connected to node Vref in FIG. 1.

OBJECTS OF THE INVENTION

It is an object of the invention to provide a new and improved MOS to ECL level conversion circuit.

It is another object of the invention to provide a new and improved MOS to ECL level conversion circuit which provides complementary action.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are achieved by a MOS (metal oxide semiconductor), also including CMOS (complementary metal oxide semiconductor), to ECL level conversion circuit comprising first and second transistors forming a differential pair connected to a current source. The first transistor from the pair is configured as a diode and is self referencing in that it supplies its own reference voltage level independent of the voltage level at the circuit input. Alternatively, the diode configured first transistor is a diode.

Several additional embodiments of the invention provide logic circuitry to the input of the second transistor of the differential pair so as to implement various logical functions with the circuit.

BRIEF DESCRIPTION OF THE DRAWINGS

FIGS. 6 and 6a are a schematic drawing and truth table of a fifth preferred embodiment of the invention.

FIGS. 7 and 7a are a schematic drawing and truth table of a sixth preferred embodiment of the invention.

DETAILED DESCRIPTION OF THE INVENTION

Figure 2:
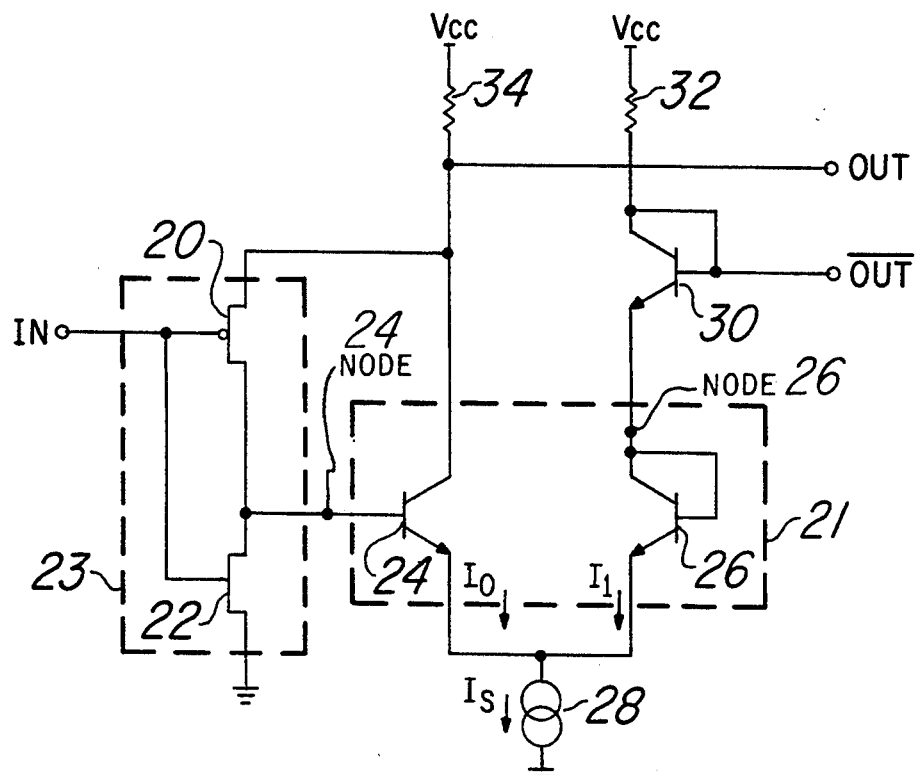
FIG. 2 is a schematic drawing of a first preferred embodiment of the invention.

A first preferred embodiment of the invention will be described with reference to the schematic drawing of FIG. 2. FIG. 2 illustrates emitter coupled bipolar differential transistor pair 21 comprising bipolar transistor 24 and diode configured transistor 26 with its base tied to its collector. The emitters of transistors 24 and 26 are connected to a first terminal of constant current source 28 whose second terminal is connected to circuit ground. The collector and base of transistor 26 is connected to the emitter of diode configured bipolar transistor 30 whose base is connected to its collector at output node $_{OUT}$. The collector and base of transistor 30 are connected to one terminal of resistor 32 whose second terminal is connected to Vcc, the circuit supply voltage. The collector of transistor 24 is connected to a first terminal of resistor 34 whose second terminal is connected to Vcc. CMOS inverter 23 which comprise p-channel transistor 20 and n-channel transistor 22, has its input (the common gate of transistors 20 and 22)

connected to input node IN and its output (the common drawings of transistors 20 and 22) connected to the base of transistor 24. The source of transistor 20 is connected to the collector of transistor 24 at output node OUT. The source of transistor 22 is connected to circuit ground.

Figure 1A:
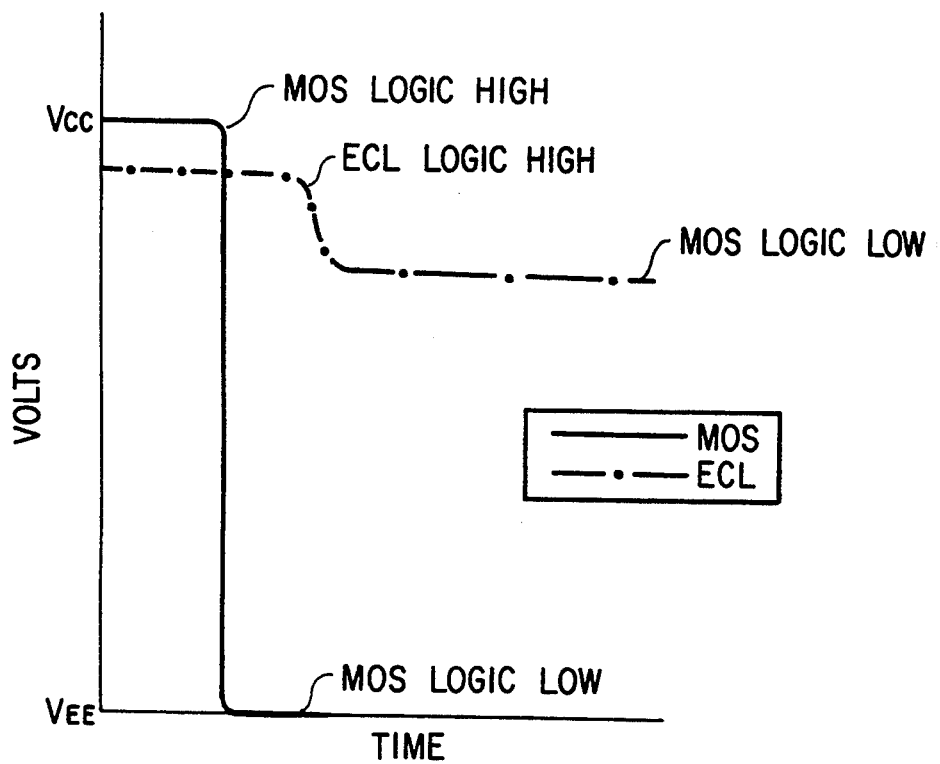
FIGS. 1a and 1b are a schematic drawing of a prior art MOS to ECL level circuit.
Figure 1B:
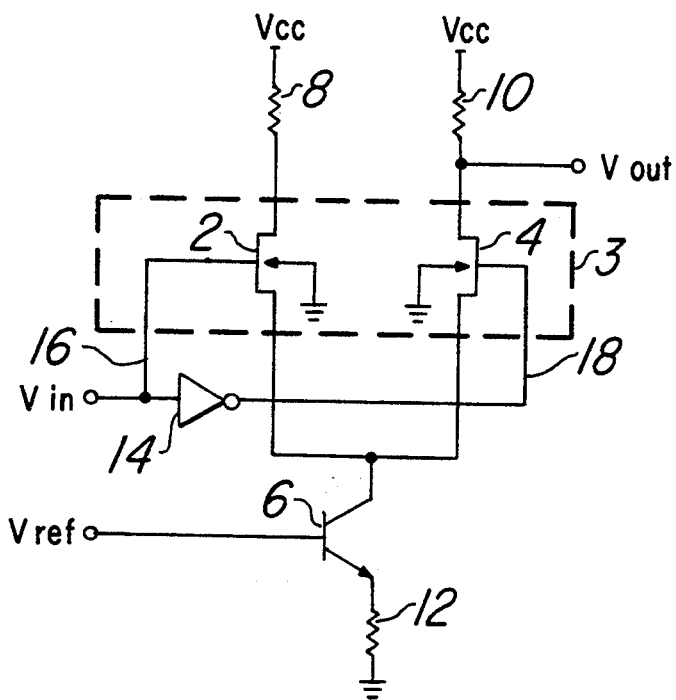

CMOS inverter 23 serves as a direct coupling input driver which together with bipolar differential pair 21 provides fast circuit output switching speed. The circuit in FIG. 1 only requires a single CMOS input signal at node IN and provides complementary output signals at nodes Out and$_{OUT}$. Also note that since this circuit uses emitter couple logic (ECL), the values of the supply voltage and resistors 34 and 32 are chosen so as to keep transistors 24 and 26 out of saturation.

In operation, a logic low input at node IN results in transistor 20 being turned on and transistor 22 being turned off. Transistor 24 is therefore on and the emitter of transistors 24 and 26 are at a voltage level which reverse biases the base-emitter voltage of transistor 26 so as to turn transistor 26 and 30 off. A logic high voltage, Vcc, thus appears at node$_{OUT}$. Current is draw through resistor 34 which is equal to current I through constant current source 28. The voltage at node OUT is equal to approximately Vcc−(I×R34), where R34 is the value of resistor 34 in ohms assuming the International System of Units (SI). This voltage at node OUT can correspond to a logic low.

A high voltage at input node IN results in turning transistor 20 off and transistor 22 on. Transistor 24 is therefore turned off since transistor 22 pulls transistor 24's base low. Node out is at Vcc which corresponds to a logic high voltage level. Node$_{OUT}$ is at a voltage level equal to approximately Vcc−(I×R32) where R32 is the value of resistor 32 in ohms assuming SI units. This voltage at node$_{OUT}$ likely will correspond to a logic low level.

As shown, the circuit in FIG. 2 has a self reference voltage level independent of the circuit input for differential pair 21, and provides complementary action on off states between transistor 24 and 26. Due to this complementary action the base collector junction is always reversed biased during circuit operation. The self-reference characteristic although inherent in the circuit shall be further defined by example with reference to FIG. 2. Self-reference independent of the circuit input refers to the characteristic that when balanced currents flow through the both sides of current branches connected to current source 28 (i.e., with respect to FIG. 2, when the emitter current $I_o$ of transistor 24 substantially equals the emitter current I of transistor 26) this means that the voltage at node 24 equals the voltage at node 26, and that the voltage of node 26, and thus the output voltage $V_{out}$ and its complement are independent of the input voltage. The following equations demonstrate this point:

| When: | $I_o = I_1$ | |
|---|---|---|
| Then: | $V_{node\ 24} =$ | $V_{node\ 26}$. |
| So: | $V_{node\ 24} =$ | $V_{cc} - (V_{r32} + V_{BE\ 30})$ |
| Where: | $V_{node\ 24} =$ | Voltage at node 24 |
| | $V_{node\ 26} =$ | Voltage at node 26 |
| | $V_{BE\ 30} =$ | Voltage across the base emitter junction of transistor 30 |
| | $V_{r32} =$ | Voltage across resistor 32 |

Figure 3:
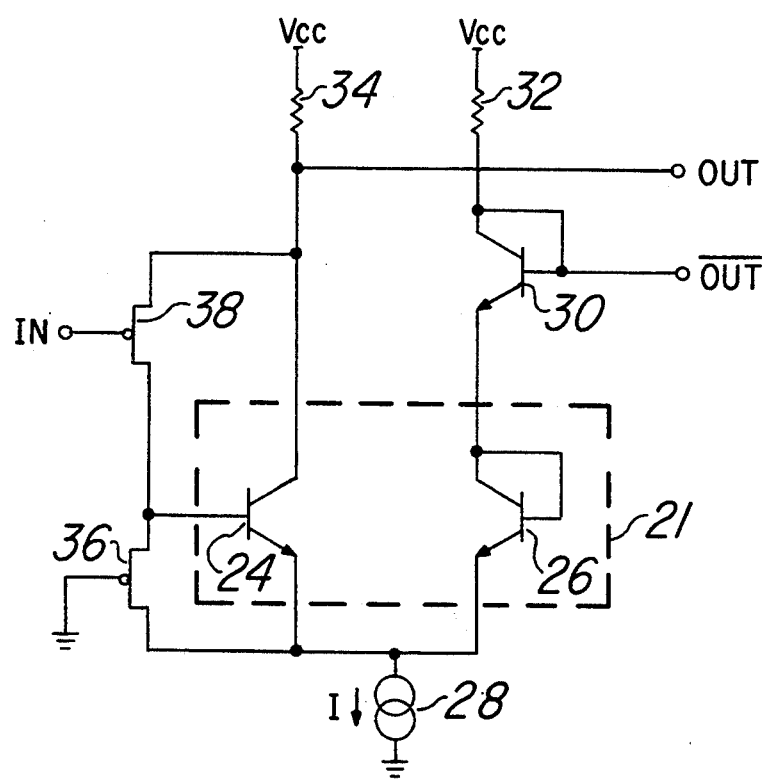
FIG. 3 is a schematic drawing of a second preferred embodiment of the invention.

FIG. 3 is a schematic drawing which illustrates a second preferred embodiment of the invention. CMOS inverter 23 comprising transistors 20 and 22 of FIG. 2 has been replaced by two p-channel MOS transistors 36 and 38. Transistors 36 and 38 have a common drain which is connected to the base of transistor 24. The source of transistor 38 is connected to node OUT while the source of node 36 is connected to the emitter of transistor 24. The gate of transistor 38 is connected to node IN while the gate of transistor 36 is connected to circuit ground leaving transistor 36 always on.

In operation, a logic low level at input node IN turns transistors 38 and 24 on so as to raise the emitter voltage of transistor 24 to a level which reverse biases transistor 26. Node$_{OUT}$ is at a voltage potential of Vcc which corresponds to a high logic level. Node OUT is at a voltage potential of approximately Vcc−(I×R34).

A high logic level at node IN turns transistor 38 off. Therefore node OUT is at a Vcc voltage potential, corresponding to a logic high while node$_{OUT}$ is at a voltage potential of approximately Vcc−(I×R32) which likely corresponds to a logic low level.

The circuit of FIG. 3 further reduces the input capacitance loading at node IN. Alternatively, transistor 36, an active load can be replaced by a passive load such as a resistor.

Figures 4, 4A:
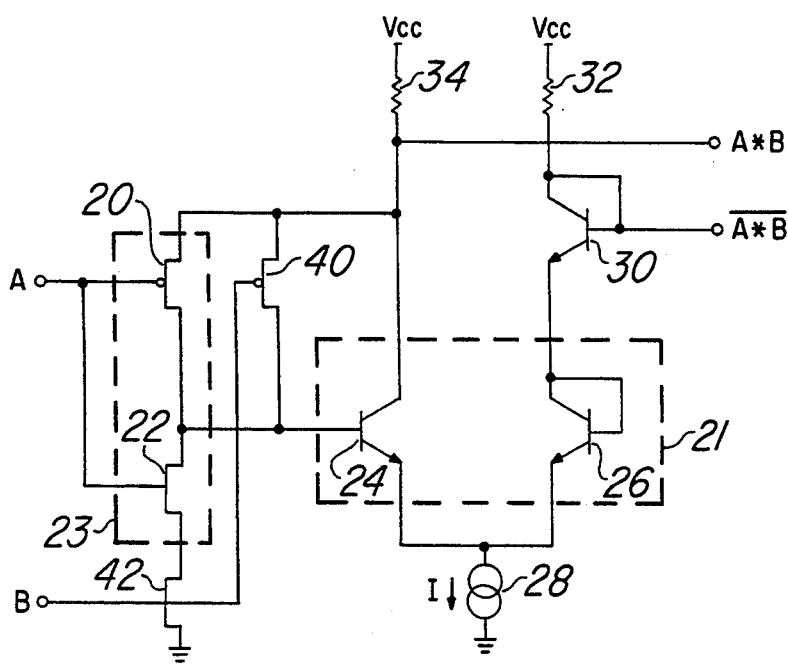
FIGS. 4 and 4a are a schematic drawing and truth table of a third preferred embodiment of the invention.

FIG. 4 is a schematic drawing of a third preferred embodiment of the invention which is a variation of the invention shown in FIG. 2. Node IN in FIG. 2 has been substituted by now labeling this input node A. Rather than connecting the source of transistor 22 to ground, the source of transistor 22 is connected to the drain of n-channel transistor 42. The gate of transistor 42 provides a second input at node B. The source of transistor 42 is connected to circuit ground. Additionally, p-channel transistor 40 shares its gate with n-channel transistor 42. The source of transistor 40 is connected to output node A*B which is the label used in place of node OUT of FIG. 2 for this output node. The drain of transistor 40 is connected to the base of transistor 24. Output node$_{A*B}$ has replaced the label for output node$_{OUT}$ in FIG. 2. Note that nodes A*B and nodes$_{A*B}$ reflect the logic operation performed on the input to nodes A and B.

In operation, this circuit performs a NAND operation at node$_{A*B}$ and an AND operation at node A*B on inputs at nodes A and B. FIG. 4a shows a truth table indicating the logic values ("O" corresponding to a logic low and "1" corresponding to a logic high) at output nodes A*B and$_{A*B}$ corresponding to logic values at inputs A and B. A logic low at node A results in turning transistor 20 and 24 on. This raises the emitter voltage of transistor 24 and consequently results in transistor 26 and 30 being turned off. Regardless of the logic value at node B node, as shown by the table in FIG. 4a, A*B will have a low logic value corresponding to a voltage of approximately Vcc−(I−R34). Since transistors 26 and 30 are shut off during an A="O" state, node $_{A*B}$ has a logic high state. Additionally, transistor 22 is shut off while transistor 40 is turned on during an A="O" state. When a logic high value appears at node A, and a logic low value appears at node B, transistor 24's base floats high resulting in turning in turning transistor 24 on and pulling node A*B low. Transistors 26 and 30 are shut off and therefore node $_{A*B}$ is at a voltage level corresponding to a logic high. When inputs at nodes A and B are both high, transistor 24 is turned off and resulting in pulling node A*B high. Current is then pulled through resistor 32, resulting in a logic low at node $_{A*B}$. The voltage at node $_{A*B}$ is equal to approximately Vcc−(I*R32).

Figures 5, 5A:
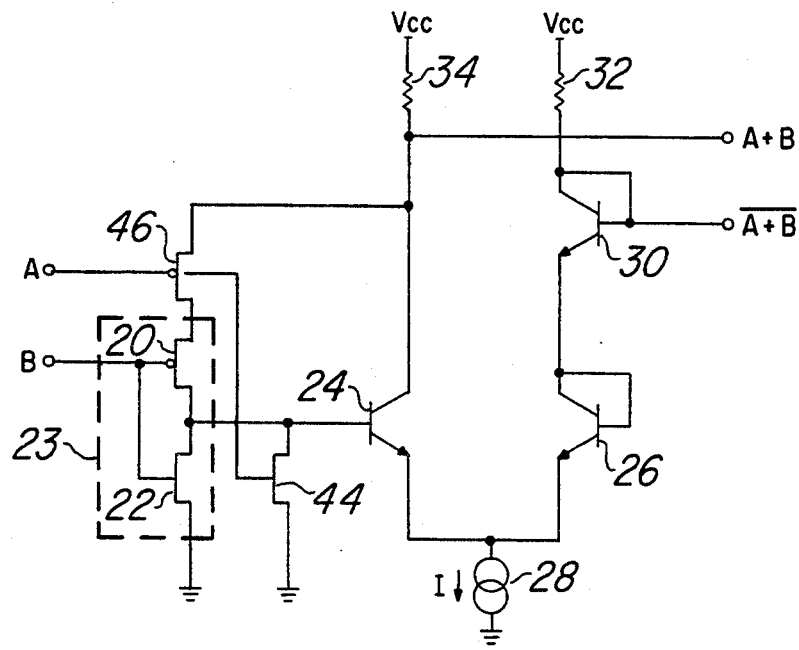
FIGS. 5 and 5a are a schematic drawing and truth table of a fourth preferred embodiment of the invention.

FIG. 5 is a schematic drawing of a fourth preferred embodiment of the invention. This drawing is a variation of the circuit shown in FIG. 2. However, p-channel transistor 46 has its drain connected to the source of transistor 20 and its source connected to node A+B which is the label which has been substituted for node OUT in FIG. 2. Additionally, node $_{\overline{A+B}}$ has been substituted for FIG. 2's node $_{\overline{OUT}}$. The gate of transistor 46 is connected to node A. Node B is a label used in place of FIG. 2's node IN. As shown, this circuit has two inputs A, and B and the outputs A+B and $_{\overline{A+B}}$ demonstrate the operations performed on the inputs A and B of the circuit. Additionally, n-channel transistor 44 shares its gate with transistor 46 and has its drain connected to the gate of transistor 24. Transistor 44's source is connected to ground.

In operation, node A+B performs on OR operation on inputs A and B and node $_{\overline{A+B}}$ performs a NOR operation on inputs A and B. FIG. 5a illustrates a truth table of the operation performed by the circuit. Zero corresponds to a logic low and 1 corresponds to a logic high. When node a and node B are at a voltage level corresponding to a logic low, transistors 20 and 46, as well as transistor 24, are turned on. Transistors 22 and 44 are turned off. Node A+B, therefore, is at a voltage value corresponding to a logic low which equals approximately Vcc−(I*R34). The base of transistor 24 is raised to a voltage level such that transistors 26 and 30 are turned off. Therefore, node $_{\overline{A+B}}$ is at a high voltage level. When node A is at a low voltage level and node B is at a high voltage level transistors 46 and 22 are turned on. Transistors 20 and 44 are turned off. The voltage at node A+B therefore is pulled to a high voltage level. Current is drawn through resistor 32, and therefore, the voltage at node $_{\overline{A+B}}$ is at a level corresponding to a logic low. The voltage at node $_{\overline{A+B}}$ is approximately Vcc−(I*R32). When node A is at a high voltage level and node B is at low voltage level, transistors 46 and 22 are shut off. Transistors 20 and 44 are turned on, resulting in transistor 24 being turned off. Therefore, the voltage value at node A+B corresponds to a logic high. Resistor 32 draws current and the voltage at node $_{\overline{A+B}}$ corresponds to a logic low value which equals approximately Vcc−(I*R32). When nodes A and B are both at high logic levels, transistors 46 and 20 are shut off, while transistors 22 and 44 are turned on. This results in turning transistor 24 off and a voltage value corresponding to a logic high to appear at node A+B. This voltage is approximately Vcc. Current is drawn through resistor 32 and the voltage at node $_{\overline{A+B}}$ is at a logic low value, which equals approximately Vcc−(I*R32).

FIG. 6 is a fifth preferred embodiment of the invention which is a variation of the circuits shown in FIG. 3. Node A has been substituted for the label of node IN in FIG. 3. P-channel transistor 48 has been added with its drain connected to the base of transistor 24 and its source connected to node A*B which has been substituted for node OUT in FIG. 3. Node B is connected to the gate of transistor 48, and node $_{\overline{A*B}}$ has been substituted for node $_{\overline{OUT}}$ of FIG. 3. The labeling of nodes A*B and $_{\overline{A*B}}$ reflect the operation of the circuit on nodes A and B. FIG. 6a illustrates a truth table of the circuit operation. When nodes A and B are at a level corresponding to a logic low, transistors 38, 36, and 48 are on. This turns transistor 24 on and therefore results in node A*B being at a logic low. The emitter of transistor 24 is high enough to shut off resistors 30 and 26.

Therefore, node $_{\overline{A*B}}$ is at a logic high value. When node A is at a logic low value and node B is at a logic high value, transistor 38 and 36 are turned on, and transistor 48 is turned off. Node A*B is therefore at a logic low and node $_{\overline{A*B}}$ is therefore at a logic high. When node A is at a voltage level corresponding to a logic high and node B is at a voltage level corresponding to a logic low. Transistors 48 and 36 are turned on while transistor 38 is shut off. This causes node A*B to be at a low logic value. No current flows through resistor 32 and therefore node $_{\overline{A*B}}$ is at a high logic level. When nodes A and B are at values corresponding to high logic levels, transistors 38 and 48 are turned off while transistor 36 is turned on. Therefore, transistor 24 is shut off and node A*B is at a high logic level. Current flows through resistor 32 and node $_{\overline{A*B}}$ is at a low logic level which is approximately equal to Vcc−(I*R32).

FIG. 7 is a schematic drawing of a sixth preferred embodiment of the invention, which is a variation of the circuit illustrated in FIG. 3. However, FIG. 3's node IN has been relabeled node B and p-channel transistor 50 has been added with its drain connected to the source of transistor 38 and its source connected to node A+B which has been substituted for FIG. 3's node OUT. Node $_{\overline{A+B}}$ has been substituted for FIG. 3's node $_{\overline{OUT}}$ and the gate of transistor 50 is connected to node A. Nodes A+B and $_{\overline{A+B}}$ reflect the operation of the circuit performed on nodes A and B.

In operation, low logic levels at nodes A and B result in transistors 50 and 38 being turned on. transistor 36 is on as well. Transistor 24 is, therefore, turned on and node A+B is at a low logic level equal to approximately Vcc−(I*R32). Node $_{\overline{A+B}}$ is at a high logic level since transistors 26 and 30 are off due to the high voltage level at the emitter of transistor 24. A low logic level at node A and a high logic level at node B result in turning transistor 50 on and transistor 38 off. Transistor 36 is on as well. this results in pulling the base of transistor 24 low, thus shutting transistor 24 off. Therefore node A+B is at a high voltage level equal to approximately Vcc. Current is drawn through resistor 32, resulting in node $_{\overline{A+B}}$ being at a low voltage level equal to approximately Vcc−(*R32). A high voltage level at node A and a low voltage level at node B result in turning transistor 50 off and transistor 38 on. Transistor 36 is turned on as well. Therefore, the base of transistor 24 is pulled low thus shutting transistor 24 off. Therefore, a low voltage corresponding to a logic high appears at node A+B. Current is pulled through resistor 32 causing the voltage at node $_{\overline{A+B}}$ to be at logic low level equal to approximately Vcc−(I*R32). When nodes A and B are at high logic levels, transistors 50 and 38 are shut off. Transistor 36 is turned on and thus pulls the base of transistor 24 low. Therefore, node A+B is at a high logic level. Current is pulled through resistor 32 and node $_{\overline{A+B}}$ is at a low logic level equal to approximately Vcc−(I*R32). A truth table of the logic operation performed by FIG. 7 is shown in FIG. 7a.

Figure 8:
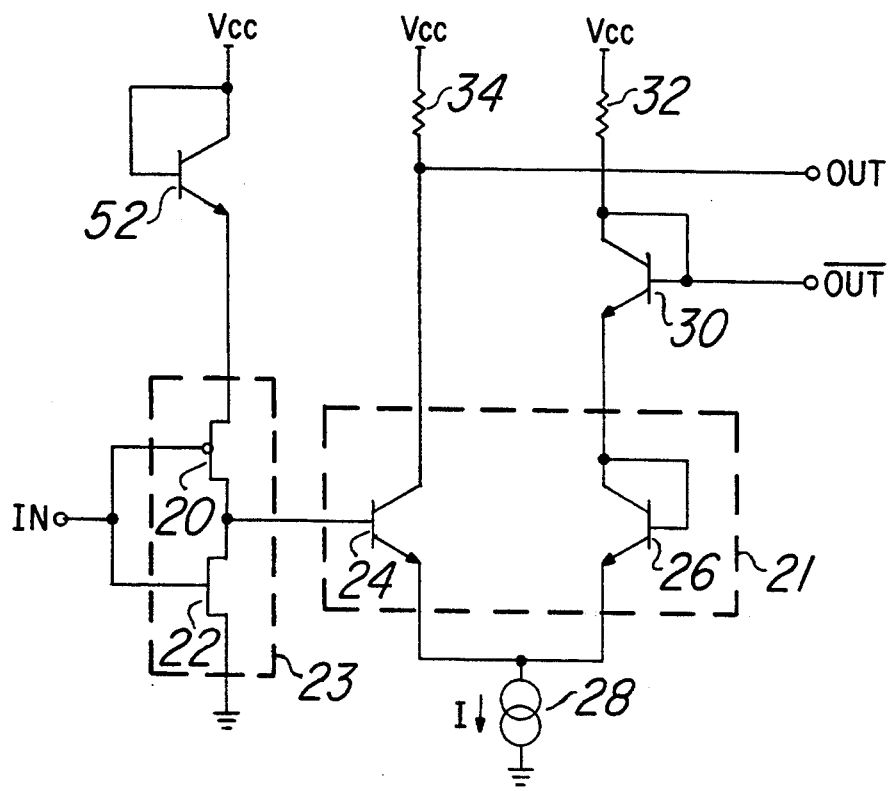
FIG. 8 is a schematic drawing of a seventh preferred embodiment of the invention.

FIG. 8 is a schematic drawing illustrating a seventh preferred embodiment of the invention, which is a variation of the circuit illustrated in FIG. 2. However, rather than connecting the source of transistor 20 to node OUT, this source is connected to the emitter of diode configured bipolar transistor 52 whose base and collector are connected to circuit supply voltage, Vcc. This circuit connection reduces the capacitive loading on the output nodes, OUT and $_{\overline{OUT}}$, of the differential pair 21.

Figure 9:
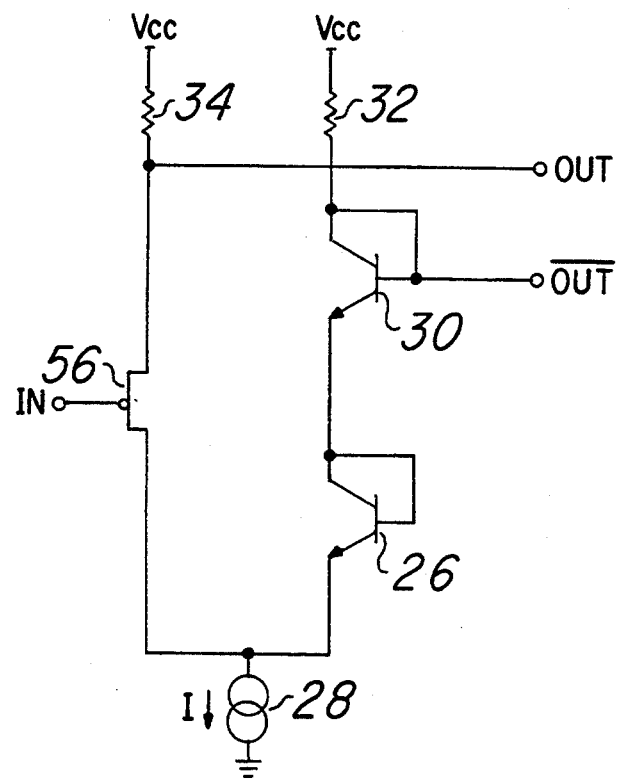
FIG. 9 is a schematic drawing of a eighth preferred embodiment of the invention.

FIG. 9 illustrates a schematic drawing of an eighth preferred embodiment of the invention. This embodiment uses p-channel transistor 56 differentially paired with diode configured transistors 26 and 30. resistor 34 is connected between the source of transistors 56 and Vcc and resistor 32 is connected between the collector of transistor 30 and Vcc. Current source 28 is connected to the drain of transistor 56 and the emitter of transistor 26. Input node IN is connected to the base of transistor 56 while output node OUT is connected to the source of transistor 56 and output node $_{OUT}$ is connected to the base of transistor 30. A logic low input at node IN turns on transistor 56 producing a voltage at node OUT corresponding to logic low. No current flows through resistor 32 and thus a high logic level appears at node $_{OUT}$. A logic high at node IN produce a logic high at node OUT since no current flows through transistor 56 and resistor 34 with this input. Correspondingly a logic low appears at node $_{OUT}$.

Figure 10:
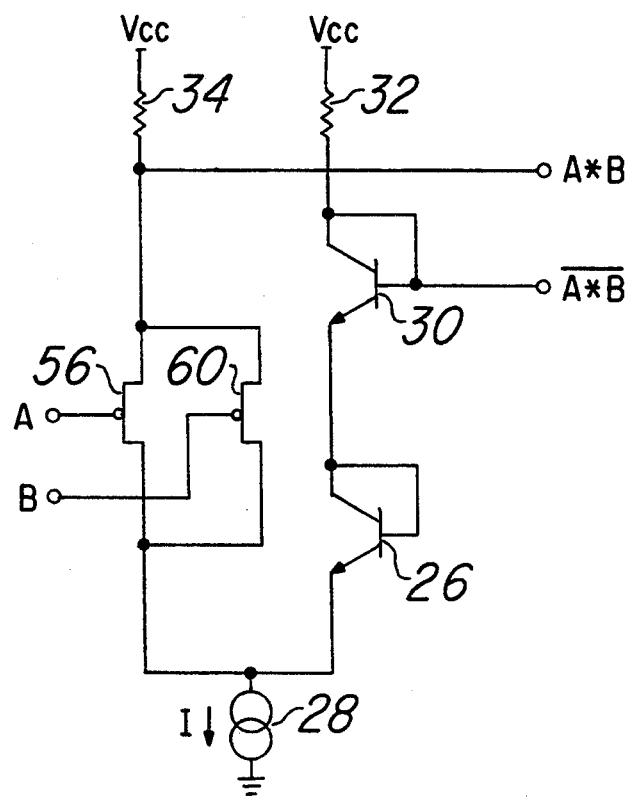
FIG. 10 is a schematic drawing of a ninth preferred embodiment of the invention.

FIG. 10 illustrates a ninth preferred embodiment of the invention which is a variation of the circuit shown in FIG. 9. Node IN of FIG. 9 has been relabeled node A and p-channel transistor 60 has been added with n-channel transistor 60's source connected to the source of transistor 56 and transistor 60's drain connected to the drawing of transistor 56. The gate of transistor 60 is connected to node B. Node OUT of FIG. 9 has been relabeled node A*B and node $_{OUT}$ has been relabeled node $_{A*B}$ to reflect the operation of the circuit on nodes A and B. A logic low voltage at either nodes A or B produces a logic low at node A*B and a logic high at node $_{A*B}$, A logic high at both nodes a and B produces a logic high at node A*B and correspondingly a low logic level at node $_{A*B}$.

Figure 11:
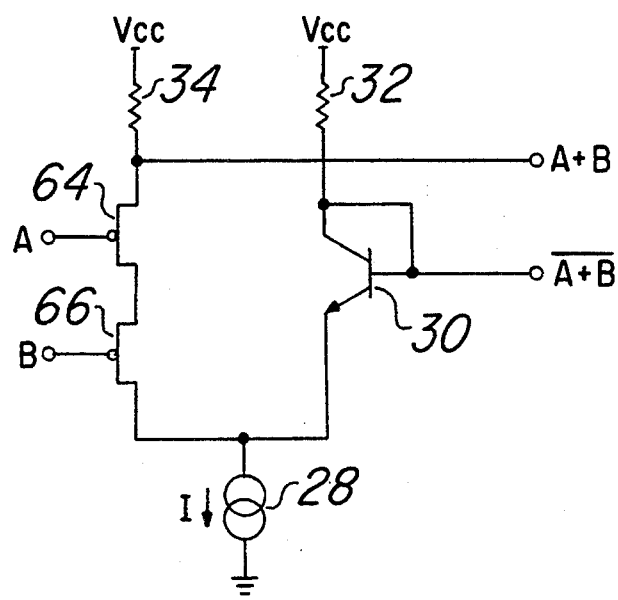
FIG. 11 is a schematic drawing of a tenth preferred embodiment of the invention.

FIG. 11 illustrates a schematic drawing of a tenth preferred embodiment of the invention which is a variation of the drawing of FIG. 9. FIG. 9's transistor 56 has been replaced by series connected p-channel transistors 64 and 66. FIG. 9's node OUT has been relabeled node A+B and FIG. 9's node $_{OUT}$ has been relabeled node $_{A+B}$. Although transistor 26 has been removed in this figure, it can be optionally added to increase circuit stability. In operation, a logic high in at either nodes A or B will produce a logic high at node A+B and a logic low at node $_{A+B}$ due to the off state of either transistors A or B. A logic low at both nodes A and B will create a logic low at node A+B and a logic high at node $_{A+B}$ since transistors 64 and 66 will turn on and transistor 30 will turn off.

Although the invention has been described in detail herein with reference to its preferred embodiment, it is to be understood that this description is by way of example only, and is not to be construed in a limiting sense. It is to be further understood that numerous changes in the details of the embodiments of the invention and additional embodiments of the invention, will be apparent to, and may be made by persons of ordinary skill in the art having reference to this description. For instance, another type of field effect transistor instead of an MOS transistor may be substituted for an MOS transistor. Additionally, other logic elements, such as logic gates may be connected to the input of the differential pair. Furthermore, all diode configured transistors may be substituted with diodes. It is contemplated that all such changes and additional embodiments are within the true scope and spirit of the invention as claimed below.

I claim:

1. A MOS, including CMOS, to ECL level conversion circuit comprising:
   a current source;
   a first and second transistor comprising a differential pair connected to said current source, said first transistor being configured as a diode and being self-referencing, independent of the input to said circuit, so as to supply its own reference voltage level; and
   an inverter connected to the input of said second transistor.

2. A MOS to ECL level conversion circuit as recited in claim 1, which further includes a first field effect transistor including a gate common with the gate of said CMOS inverter and a second field effect transistor connected to said CMOS inverter.

3. A MOS to ECL level conversion circuit as recited in claim 1 which further includes a first field effect transistor connected to said CMOS inverter which includes a common gate with a second field effect transistor connected to said second transistor of said pair.

4. A MOS, including CMOS, to ECL level conversion circuit comprising:
   a current source;
   a first and second transistor comprising a differential pair connected to said current source, said first transistor being configured as a diode and being self-referencing, independent of the input to said circuit, so as to supply its own reference voltage level; and a second diode configured transistor connected in series with said first transistor of said pair.

5. A MOS, including CMOS, to ECL level conversion circuit comprising:
   a current source;
   a first and second transistor comprising a differential pair connected to said current source, said first transistor being configured as a diode and being self-referencing, independent of the input to said circuit, so as to supply its own reference voltage level, said second transistor being a bipolar transistor; and
   a first field effect transistor connected to the base of said second transistor and to said current source.

6. A MOS to ECL level conversion circuit as recited in claim 5 which further includes a second and third field effect transistor connected in series and connected to said first field effect transistor.

7. A MOS to ECL level conversion circuit as recited in claim 5 which further includes a second field effect transistor and a third field effect transistor connected in parallel and connected to both said first field effect transistor and said base of said second transistor of said pair.

* * * * *